(12) United States Patent
Yoshimura

(10) Patent No.: US 6,421,274 B1
(45) Date of Patent: Jul. 16, 2002

(54) SEMICONDUCTOR MEMORY DEVICE AND READING AND WRITING METHOD THEREOF

(75) Inventor: Yoshimasa Yoshimura, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/983,649

(22) Filed: Oct. 25, 2001

(30) Foreign Application Priority Data

Mar. 23, 2001 (JP) ........................................ 2001-084921

(51) Int. Cl.[7] .............................................. G11C 16/04
(52) U.S. Cl. ............................ 365/185.12; 365/189.04; 365/189.05; 365/230.08
(58) Field of Search ...................... 365/185.12, 230.08, 365/189.05, 230.06, 230.03, 189.04, 189.01, 185.09

(56) References Cited

U.S. PATENT DOCUMENTS 6,145,050 A * 11/2000 Kaki et al. ............. 365/185.29
6,172,906 B1 * 1/2001 Estakhri et al. ......... 365/189.04
6,202,138 B1 * 3/2001 Estakhri et al. ......... 365/189.04
6,353,571 B1 * 3/2002 Norman et al. ......... 365/230.03

FOREIGN PATENT DOCUMENTS

JP              64-74649         3/1989

* cited by examiner

Primary Examiner—Richard Elms
Assistant Examiner—Tuan T. Nguyen
(74) Attorney, Agent, or Firm—McDermott, Will & Emery

(57) ABSTRACT

A capacity size of a single block of a flash memory (2) is an integer multiple of a single sector size which is a processing unit of an external host (4), and each of the first and second buffer RAMs interposed between the external host and the flash memory has a capacity corresponding to a single sector size of the flash memory, and data transmission between the external host and the buffer RAMs and between the flash memory and the buffer RAMs are performed by alternately selecting different buffer RAMs, and thus the data transmission between the buffer RAMs and the external host is performed simultaneously. and in parallel with performing the data transmission between the buffer RAMs and the flash memory.

7 Claims, 8 Drawing Sheets

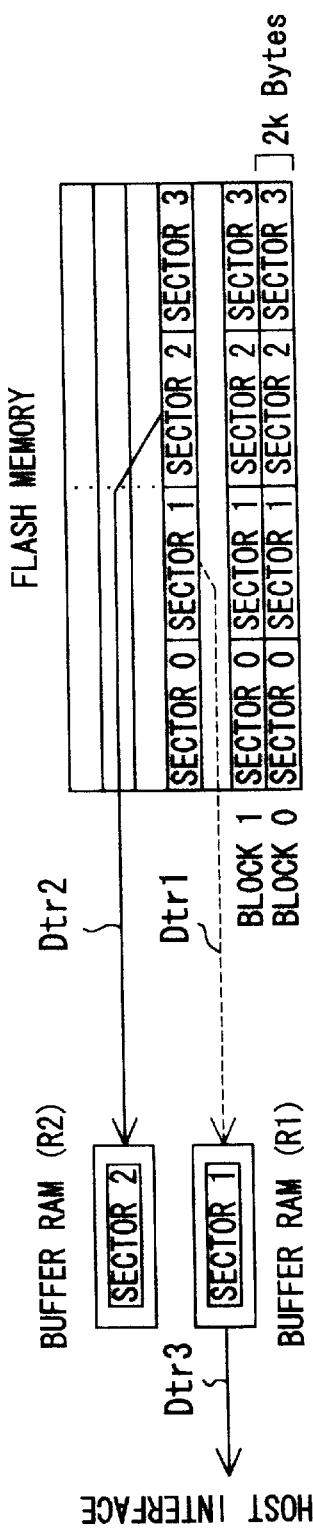
Fig. 2A READING OPERATION
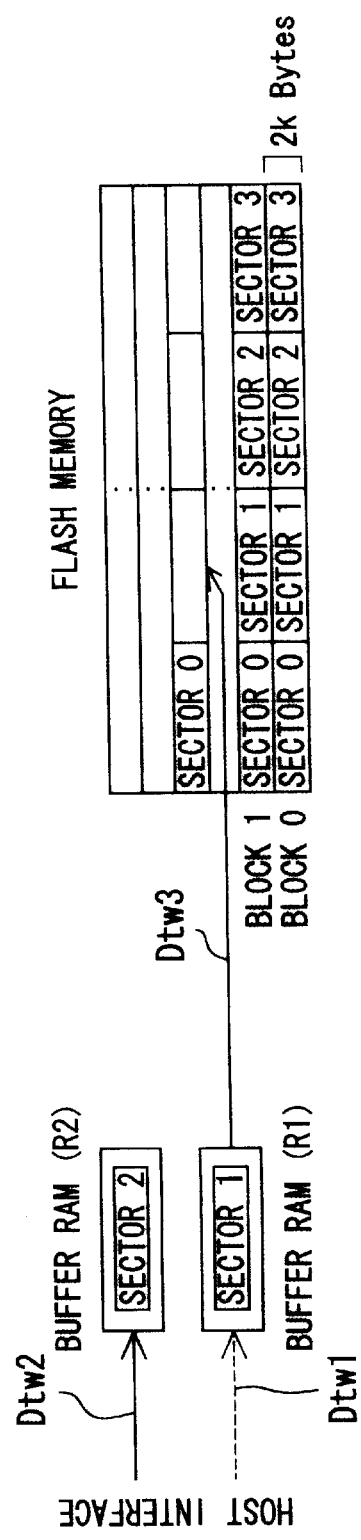
Fig. 2B WRITING OPERATION

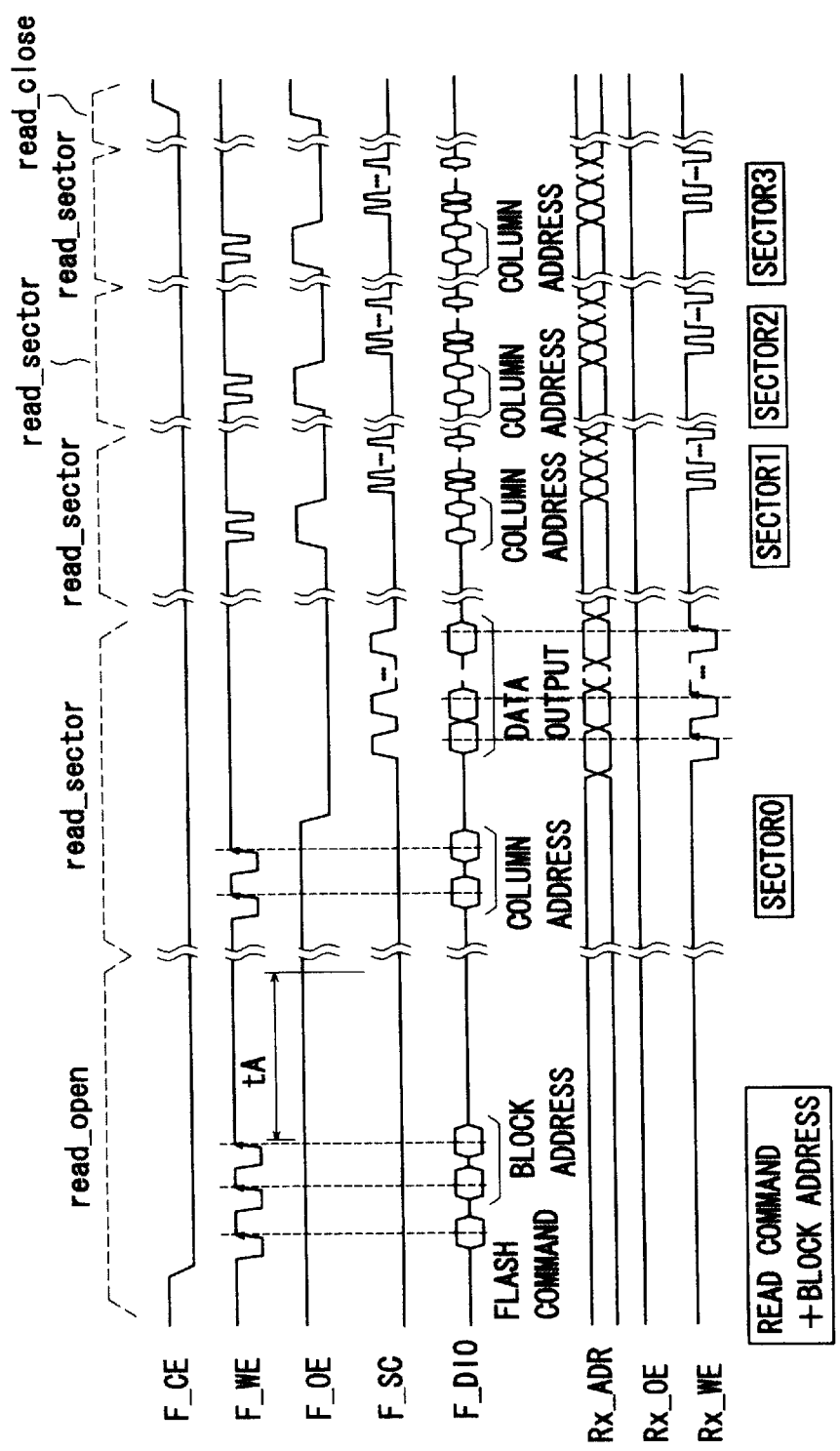
Fig. 3A SEQ CONTROL SIGNALS IN READING

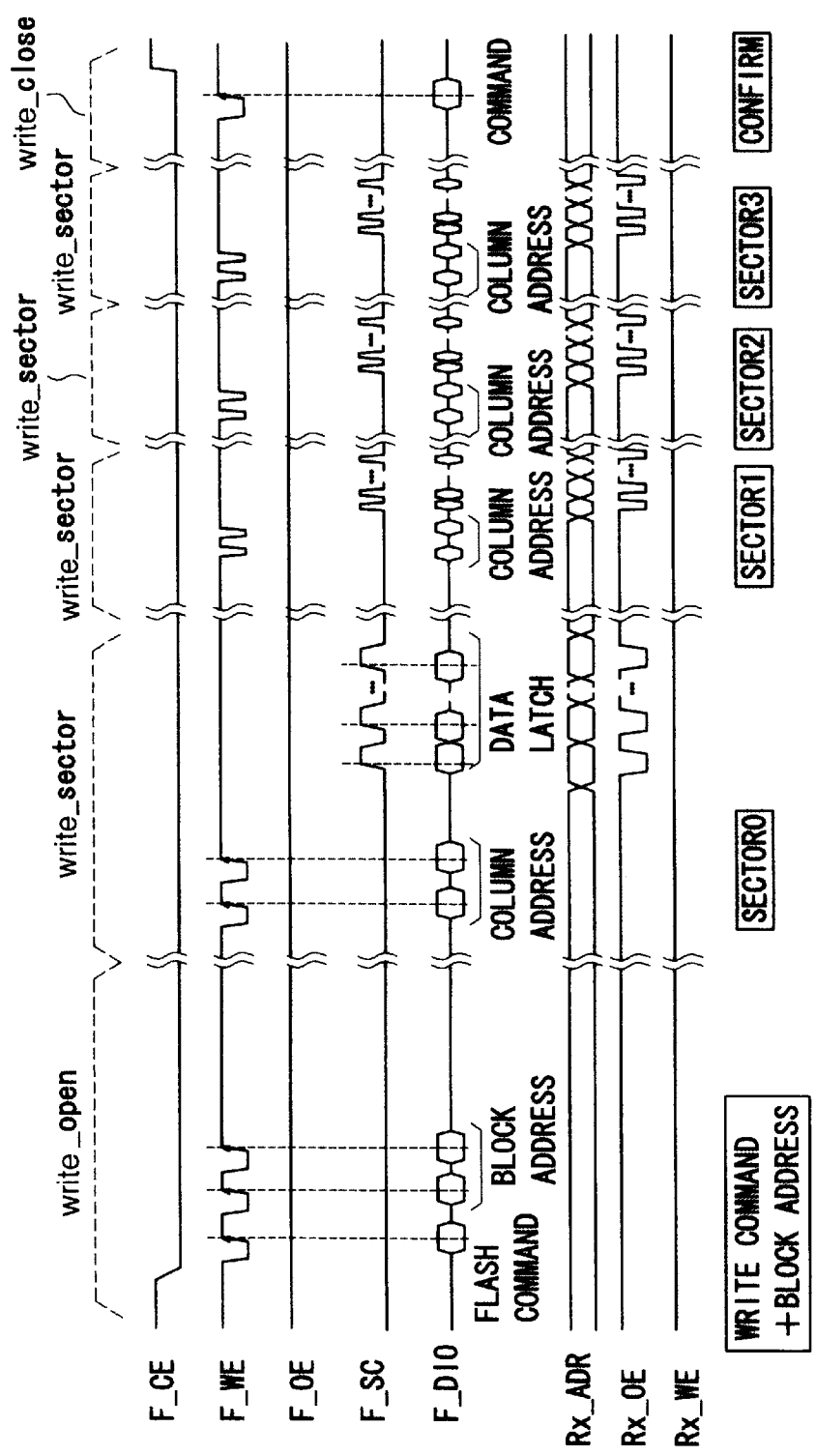
Fig. 3B SEQ CONTROL SIGNALS IN WRITING

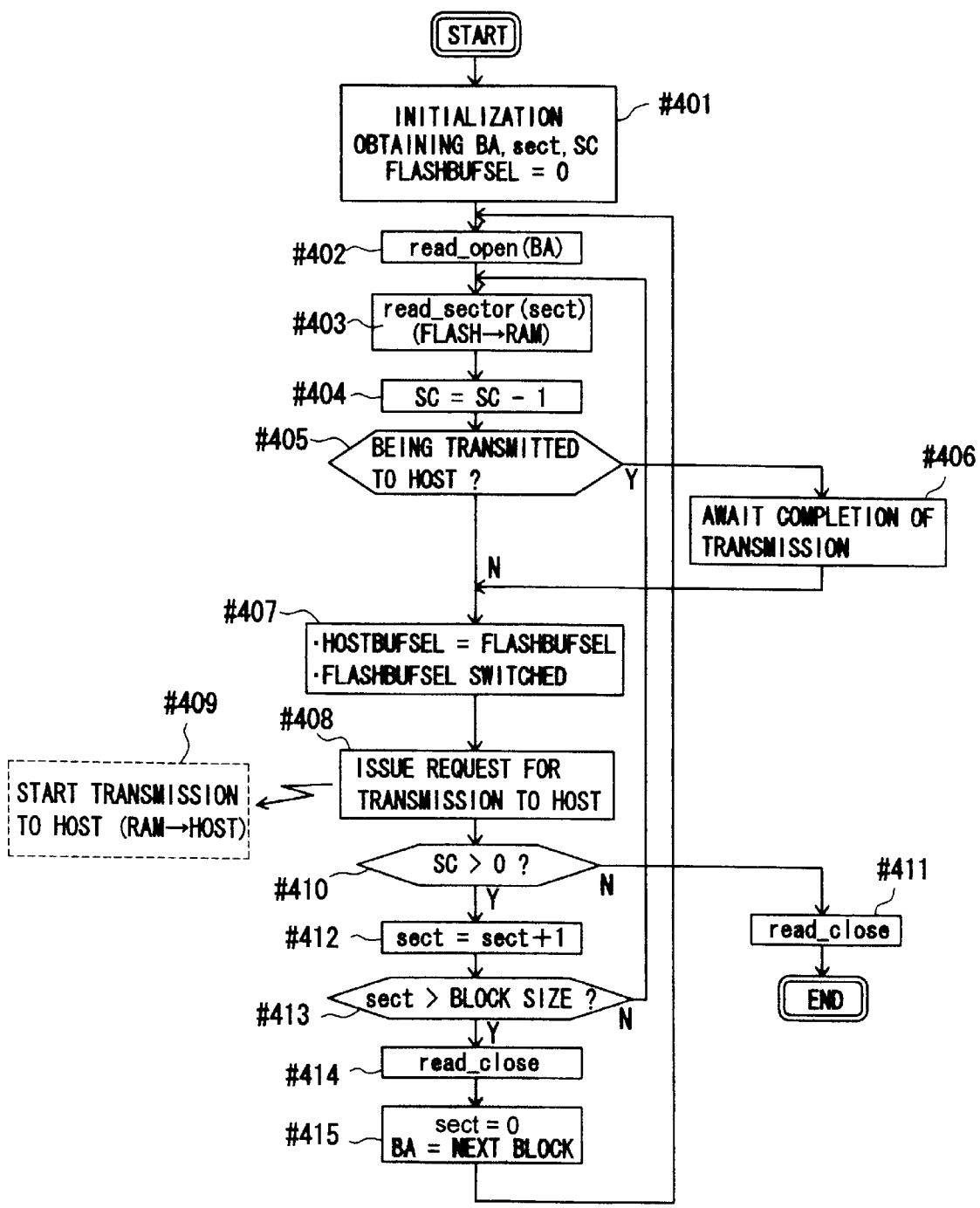
Fig. 4 READING OPERATION

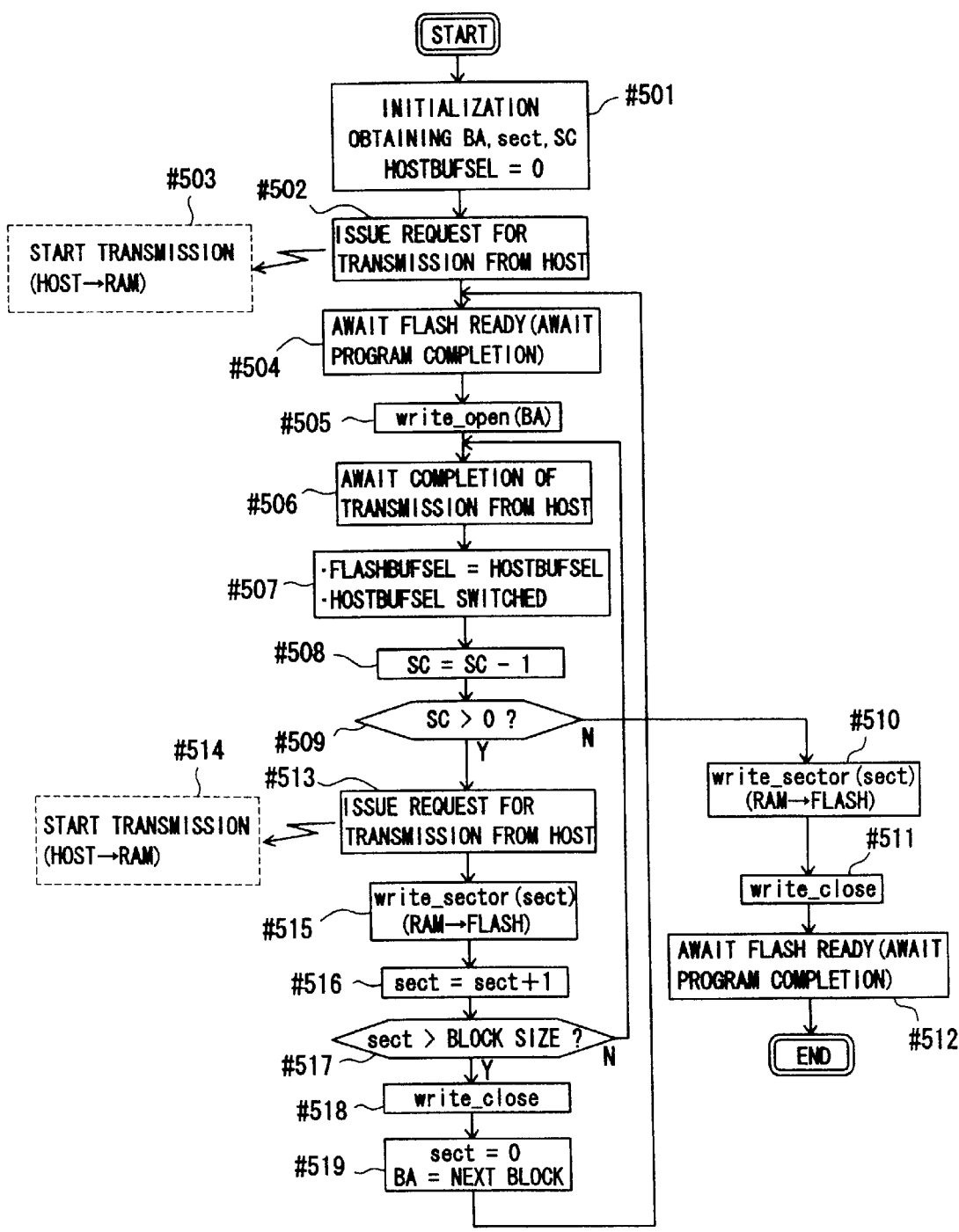
Fig. 5 WRITING OPERATION

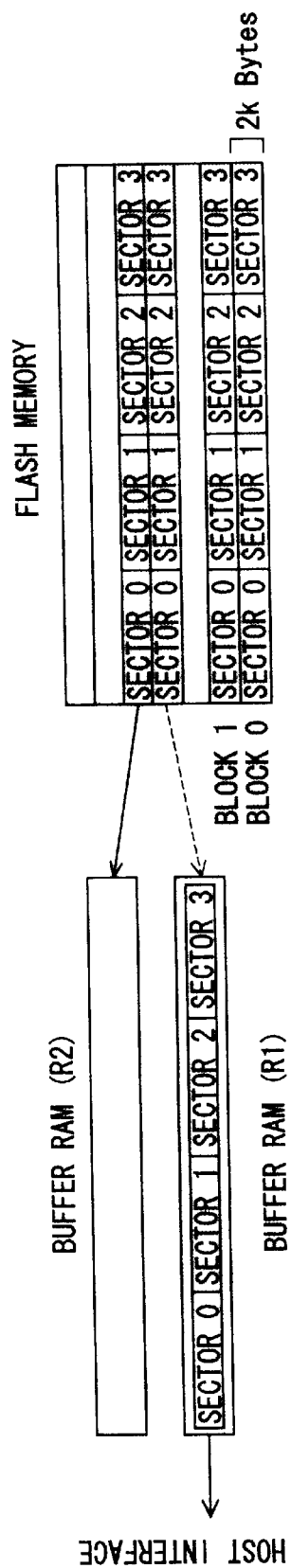
Fig. 7A READING OPERATION PRIOR ART
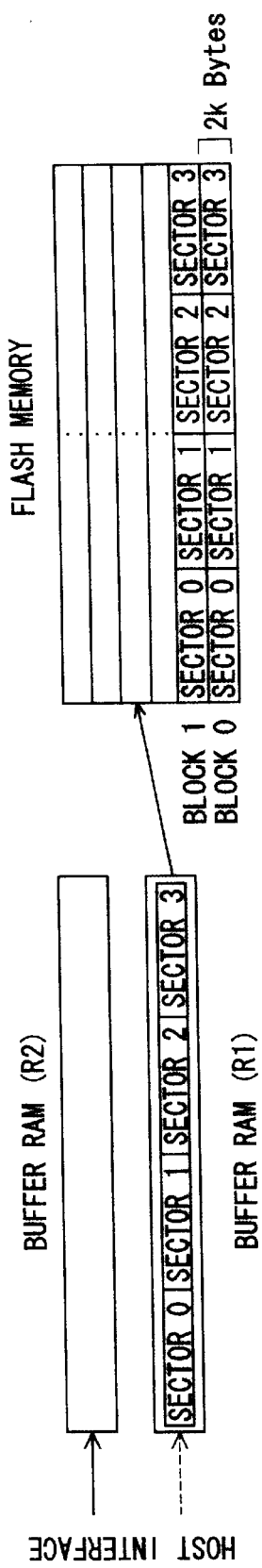
Fig. 7B WRITING OPERATION PRIOR ART

SEMICONDUCTOR MEMORY DEVICE AND READING AND WRITING METHOD THEREOF

BACKGROUND OF THE INVENTION

1. Field of the Invention

The present invention relates to a semiconductor memory device, and particularly to a semiconductor memory device of large capacity such as a semiconductor disk device employing a flash memory in which reading, writing and erasing are performed in block units, and employing a memory of a large capacity as a nonvolatile semiconductor memory for realizing high performance with reduction in manufacturing costs.

2. Description of the Prior Art

Examples of conventionally used nonvolatile semiconductor memories are, for instance, M5M29F25611VP manufactured by Mitsubishi Electric Corporation and HN29W25611 manufactured by Hitachi Ltd., which are flash memories performing read and write processes in block units of 2 k bytes. In a semiconductor memory device mounted with such a flash memory, the flash memory includes a plurality of blocks each of which are of 2 k bytes as illustrated in FIG. 7 for enabling parallel processing of data transmission to/from the host terminal and data transmission to/from the flash memory, wherein each of two buffer RAMs (R1, R2) has a capacity size corresponding to a single block.

In a conventional semiconductor memory device as illustrated in FIG. 7, the capacity of each buffer RAM corresponds to a capacity size of a single block, that is, an integer multiple of a single sector size (e.g. corresponding to four sector sizes in the figure).

Transmission of data between the host terminal and the buffer RAM and transmission of data between the flash memory and the buffer RAM are performed in a manner that separate buffer RAMs are respectively selected between the two buffer RAMs (R1, R2), wherein when data is sent and received between either one buffer RAM (e.g. R1) and the host terminal, data is sent and received between the other buffer RAM (e.g. R2) and the flash memory.

Transmission of data between the buffer RAM and the host terminal and between the buffer RAM and the flash memory is performed in a manner that data of a plurality of sectors corresponding to a single block is transmitted in one lump sum, and commands for the flash memory are issued in blocks (i.e. in a unit of four sectors).

FIG. 7A is a schematic view illustrating a conventional operation of reading data from the flash memory to the host terminal, and FIG. 7B is a schematic view illustrating a conventional operation of writing data from the host terminal to the flash memory, wherein the flash memory is comprised of a plurality of blocks each of which has a block size of 2 k bytes (i.e., four sector sizes).

In the operation for reading data from the flash memory as illustrated in FIG. 7A, transmission of data as indicated by a broken-line arrow indicates that data of a single block is preliminarily read from the flash memory and stored in one buffer RAM, i.e., buffer RAM (R1), and then both transmissions of data as indicated by solid-line arrows are simultaneously performed. In other words, simultaneously with reading out the data which are preliminarily stored in the buffer RAM (R1) from the buffer RAM (R1) and transmitting the same to the host, data of next block are read out from the flash memory and transmitted to the other buffer RAM (R2) to be stored therein.

Similarly, in performing an operation of writing data to the flash memory from the host terminal as illustrated in FIG. 7B, transmission of data as indicated by a broken-line arrow indicates that data of a single block are preliminarily stored in one buffer RAM (R1) from the host, and then both transmissions of data as indicated by the solid-line arrows are simultaneously performed. In other words, simultaneously with reading out data which are preliminarily stored in the buffer RAM (R1) and transmitting the same to the flash memory, data of next block are transmitted from the host terminal and transferred to the other buffer RAM (R2) to be stored therein.

Japanese Patent Unexamined Laid-open Publication No. 64-74649 (1989) discloses a technique related to a magnetic disk device comprising two buffer memories respectively of a capacity corresponding to a plurality of sectors, wherein data of a single sector is read out and stored in one buffer memory, and data of another sector is read and stored in the other buffer memory during transmission of the data. In this publication, however, the reason for providing two buffer memories each having a capacity corresponding to a plurality of sectors, is to simplify analysis of breakdowns by keeping hysteresis of transmitted data.

In the general conventional arrangements, since each of buffer RAMs has a capacity of a plurality of sectors, the capacity of the buffer memories becomes large. Therefore, it would be necessary to provide buffer RAMs of large structure when the capacities of flash memories further increase in future to have large block sizes of 4 k bytes or 8 k bytes and so on. Thus, increases in costs of the entire device including controllers and other members are unavoidable.

In case read commands or write commands are executed in each buffer size while these buffer sizes remained small, an overhead is excessively added for executing the command, resulting in a drawback that the efficiency is lowered and further that writing and reading speeds with respect to the host terminal side are delayed.

The present invention has been made for the purpose of solving the problems, and it is an object thereof to provide a semiconductor memory device in which the size of each of the buffer RAMs is decreased to correspond to a single sector size, which can be manufactured at low costs, which is capable of performing rapid transmission and rapid processing of writing and reading data, and further to provide a method for reading and writing thereof.

It is another object of the present invention to provide a semiconductor memory device capable of exhibiting the above performances with which it is possible to improve reliability of data by performing error correction.

SUMMARY OF THE INVENTION

In order to achieve the above-mentioned objectives, the present invention provides a semiconductor memory device which is connected to a host terminal through a system bus for data transmission. The semiconductor memory device comprises: a nonvolatile semiconductor memory having a structure of a plurality of blocks, wherein read and write commands are executed in block units, with a capacity size of a single block being an integer multiple of a single sector size corresponding to a processing unit of the host terminal for reading and writing data; a first buffer memory and a second buffer memory for mediation of data transmission between the host terminal and the nonvolatile semiconductor memory, each of the first and second buffer memories having a capacity corresponding to a single sector size of the nonvolatile semiconductor memory, and a controller for controlling data transmission in sector units between the host terminal and the buffer memories and between the nonvolatile memory and the buffer memories by alternately selecting the first and second buffer memories, and when one of the buffer memories performs transmission of data corresponding to one sector with the host terminal, the other buffer memory simultaneously performs transmission of data corresponding to another sector with the nonvolatile semiconductor memory.

The controller generates control signals to apply a read and write command with respect to a block of the nonvolatile semiconductor memory in response to a request for reading and writing data from the host terminal, and wherein transmission of data between the host terminal and the nonvolatile semiconductor memory is sequentially performed via the buffer memories every sector data.

The controller is adapted to maintain control levels of the control signals for the nonvolatile semiconductor memory in a manner that, after transmission of a single sector data, transmission of another sector data is continued to thereby perform simultaneous and parallel data transmission.

With this arrangement, it is possible to reduce the capacity of the buffer memories to enable manufacture at low costs, and since it is further possible to perform parallel processing of transmission, rapid transmission can be realized from the host terminal. Moreover, since processes are performed with respect to the flash memory in block units, it is possible to perform rapid reading and writing and thus to shorten the processing time.

The semiconductor memory device according to another aspect of the present invention further comprises an error correcting unit for performing correction control of errors of data stored in the nonvolatile semiconductor memory, wherein redundant data for the error correction of each sector data may be arranged to immediately follow the sector data.

The error correcting unit may be arranged such that, when in a data reading operation from the nonvolatile semiconductor memory to the buffer memory, each sector data and redundant data are sent to the error correcting unit simultaneously and in parallel with the data reading, and when a correctable error is detected, the sector data stored in the buffer memory is corrected, and that, when in a data writing operation from the buffer memory to the nonvolatile semiconductor memory, each sector data is transferred to the error correcting unit simultaneously and in parallel with the data writing to produce redundant data which is transmitted to the nonvolatile semiconductor memory.

With this arrangement of additionally providing a means for controlling correction of errors in data, it is possible to improve reliability of data in addition to exhibiting the above effects.

According to further another aspect of the present invention, a method of reading out data from a flash memory which is connected to a host terminal through two buffer memories connected on a system bus for data transmission, comprises steps of: performing a read_open process by applying a read command and block address with respect to a target block; performing a read_sector process with respect to a sector number of a target sector to transmit data of the corresponding sector from the flash memory to one of the buffer memories; issuing a request for data transmission to the host terminal; transmitting the data from one of the buffer memories to the host terminal upon receipt of the request; and performing a read_close process to close the block processing when the sector number is larger than a predetermined block size, wherein when one of the buffer memories performs transmission of data corresponding to a single sector with respect to the host terminal, the other buffer memory simultaneously performs transmission of data corresponding to another single sector with respect to the flash memory.

A method of writing data to a flash memory from a host terminal through two buffer memories, comprises the steps of: performing a write_open process by applying a write command and block address with respect to a target block issuing a request for data transmission to the host terminal; upon receipt of the request, sending the data to be written from the host terminal to one of the buffer memories; performing a write_sector process to transmit a target sector data from one of the buffer memories to the flash memory; and performing a write close process to close a block process when the sector number is larger than a predetermined block size value, wherein when one of the buffer memories performs transmission of data corresponding to a single sector with respect to the host terminal, the other buffer memory simultaneously performs transmission of data corresponding to another single sector with respect to the flash memory.

According to the methods of reading and writing data from and to the nonvolatile semiconductor memory, it is possible to decrease the capacity of the buffer memories to reduce manufacturing costs, and since it is further possible to perform parallel processing of transmission, rapid transmission can be realized from the host terminal. Moreover, since processes are performed with respect to the flash memory in block units, it is possible to perform rapid reading and writing and thus to shorten the processing time.

BRIEF DESCRIPTION OF THE DRAWINGS

These and other objects and features of the present invention will be readily understood from the following detailed description taken in conjunction with preferred embodiments thereof with reference to the accompanying drawings, in which like parts are designated by like reference numerals and in which:

FIGS. 2A and 2B are schematic views of data transmission during reading and writing operations in the semiconductor memory device according to the present invention;

FIGS. 3A and 3B are timing charts of flash memory control signals during reading and writing operations in the semiconductor memory device according to the present invention;

FIG. 4 is a flowchart of a reading operation of the semiconductor memory device according to the present invention;

FIG. 5 is a flowchart of a writing operation of the semiconductor memory device according to the present invention;

FIGS. 7A and 7B are schematic views of data transmission during reading and writing operations in a conventional semiconductor memory device.

DETAILED DESCRIPTION OF THE PREFERRED EMBODIMENTS

EMBODIMENT 1

Figure 1:
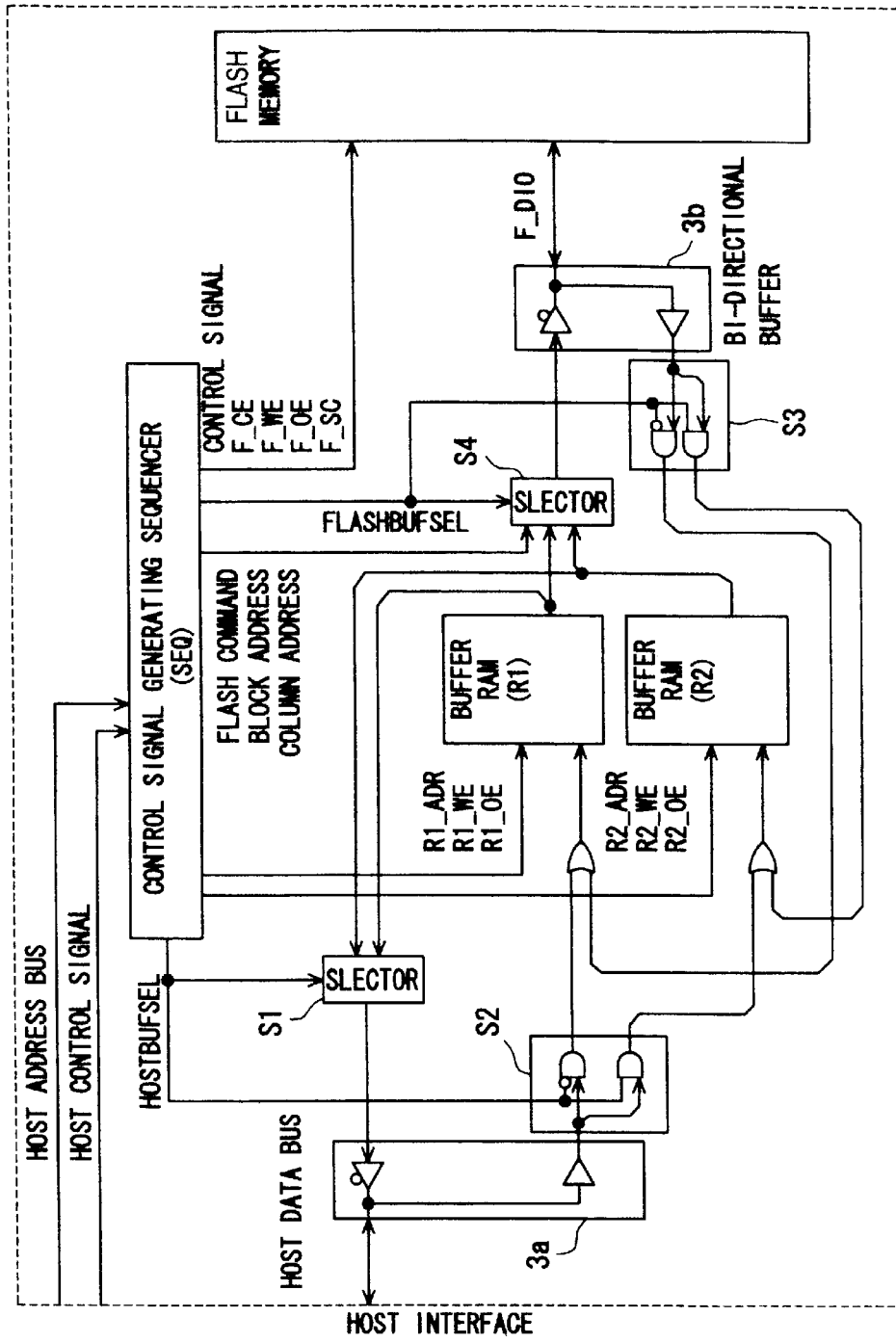
FIG. 1 is a block diagram of a first embodiment of the semiconductor memory device according to the present invention.

The first embodiment of the present invention will now be explained with reference to FIGS. 1 to 5. It should be noted that elements that are common to these drawings are marked with identical reference numerals, and that repetitive explanations are omitted.

FIG. 1 illustrates a block structure of a semiconductor memory device according to a first embodiment using a nonvolatile semiconductor memory of the present invention. In this drawing, the semiconductor memory device is comprised of a control signal generating sequencer (SEQ) 1 serving as a control signal generating means, a flash memory 2 arranged to be of a hierarchical structure including a plurality of blocks, two buffer RAMs (R1, R2), two bidirectional buffers 3a and 3b, and four selectors S1, S2, S3, S4. Each buffer RAM (R1, R2) is connected to a host interface portion 4 by a host data bus via the selectors S1 and S2 and via the bidirectional buffer 3a so as to enable reading and writing of data from and to the host terminal.

Similarly, each buffer RAM (R1, R2) is connected to the flash memory 2 by a flash memory data bus (F_DIO) via the selectors S3, S4 and via the bidirectional buffer 3b so as to enable reading and writing of data with respect to the flash memory 2, wherein the data busyo be connected to each RAM is selected by the respective selectors.

The control signal generating sequencer (SEQ) 1 provides the respective blocks with control signals at suitable timings for enabling transmission of various data. In more detail, flash memory control signals F_CE, F_WE, F OE and F_SC are supplied to the flash memory 2, flash command, block address and column address signals are supplied to the selector S4, buffer RAM control signals R1 ADR, R1_WE, R1_OE and R2_ADR, R2_WE, R2_OE are supplied to the buffer RAMs R1 and R2, respectively, and selector switching signals HOSTBUFSEL and FLASHBUFSEL are supplied to the selectors S1, S2 and S3, S4, respectively.

The selector switching signal HOSTBUFSEL is provided for selecting a buffer RAM to execute data transmission to and from the host interface 4. When the signal HOSTBUFSEL is 0 (or L), the buffer RAM R1 is selected, and when the signal HOSTBUFSEL is 1 (or H), the buffer RAM R2 is selected.

The selector switching signal FLASHBUFSEL is provided for selecting a buffer RAM to execute data transmission to and from the flash memory 2. When the signal FLASHBUFSEL is 0 (or L), the buffer RAM R1 is selected, and when the signal FLASHBUFSEL is 1 (or H), the buffer RAM R2 is selected.

The control operation of the control signal generating sequencer (SEQ) 1 will be explained later with reference to FIGS. 3A and 3B, in the case of using M5M29F25611VP manufactured by Mitsubishi Electric Corporation as an example of the flash memory.

In the semiconductor memory device shown in FIG. 1, the reading, writing and erasing processes of the flash memory are performed in block units, and a capacity size of a single block is an integer multiple of a single sector size which corresponds to a processing unit of the host terminal. The present embodiment. illustrates an arrangement example in which a single block size corresponds to four sector sizes.

In the present invention, the two buffer RAMs (R1, R2) are provided as media for data transmission between the host terminal and the flash memory, and each of the buffer RAMs (R1, R2) has a memory capacity size that is identical to the single sector size which-corresponds to a processing unit of the host terminal. Thus, data transmission between the host terminal and the buffer RAM and data transmission between the flash memory and the buffer RAM are performed by selecting either one buffer RAM between the two buffer RAMs (R1, R2). That is, when data is being sent and received between either one buffer RAM (e.g. R1) and the host terminal, data is being sent and received between the other buffer RAM (e.g. R2) and the flash memory.

In response to a request for reading/writing from the host terminal, the control signal generating sequencer (SEQ) 1 applies a read command/write command with respect to an addressed block of the flash memory, and performs transmission of data between the host terminal and the flash memory through the buffer RAMs in a sequential manner in sector units. These operations are repeated for each unit block, and the read command/write command are thus executed. After transmission of a single sector data, the level of the control signal for the flash memory is maintained so that transfer of the following sector data may be continued.

FIG. 2A is a schematic model illustrating an operation of reading data from the flash memory to the host terminal, and FIG. 2B is a schematic model illustrating an operation of writing data from the host terminal to the flash memory, wherein the flash memory is comprised of a plurality of blocks each of which has its single block size of 2 k bytes corresponding to four sector sizes.

In the operation of reading data from the flash memory as illustrated in FIG. 2A, data transmission Dtr1 as indicated by a broken-line arrow shows that data of, for instance, sector 1 is preliminarily stored in the buffer RAM (R1) from the flash memory in a preceding processing step. Then, both, data transmissions Dtr2 and Dtr3 as indicated by the solid-line arrows are simultaneously performed. More particularly, simultaneously with reading out the data of the sector 1 preliminarily stored in the buffer RAM (R1) and transmitting these to the host (Dtr3), data of the following sector 2 is read out from the flash memory to be transmitted (Dtr2) to the other buffer RAM (R2) and to be stored therein. Simultaneously with reading out the data of the sector 2 stored in the RAM (R2) and transmitting the data to the host, data of the following sector 3 is read out from the flash memory to be transmitted to the other buffer RAM (R1) and to be stored therein.

Similar to the above, in the operation of writing data from the host to the flash memory as illustrated in FIG. 2B, data transmission Dtw1 as indicated by a broken-line arrow shows that data of, for instance, sector 1 is preliminarily stored in the buffer RAM (R1) from the host terminal. Then, both, data transmissions Dtw2 and Dtw3 as indicated by the solid-line arrow are simultaneously performed. More particularly, simultaneously with reading out the data of the sector 1 preliminarily stored in the buffer RAM (R1) to be transmitted to the flash memory (Dtw3), data of the following sector 2 is read out from the host terminal to be transmitted (Dtw2) to the other buffer RAM (R2) and to be stored therein.

FIG. 3A illustrates a timing chart of waveforms of the control signals generated by the control signal generating sequencer (SEQ) 1 during an operation of reading out data from the flash memory to the buffer RAMs, and FIG. 3B illustrates a timing chart of waveforms of the control signals during an operation of writing data from the buffer RAMs to the flash memory.

Since commands for the flash memory are executed in block units (i.e., in a unit of four sectors), execution of respective commands is controlled by dividing them into steps such as a command/block address applying step (shown by "read_open", "write_open"), a sector transmitting (reading and writing) step (shown by "read_sector", "write_sector"), and a block process completing step (shown by "read_close", "write_close"). Upon completion of the respective steps, the control signal levels are maintained so that the commands for the flash memory may be continued even if there exists some time lag until the following step is performed.

In the control timing charts as illustrated in FIGS. 3A and 3B, the signal F_CE indicates a chip enable input signal, and upon start-up of F_CE, the stand-by condition is reassumed. Upon application of command/address signals, the chip enabled condition is started and the level thereof is maintained up to the block process completing step (read_close, write_close). In the drawings, the signals marked with underlines F_CE and the like indicate LOW active signals, and "tA" indicates an access time. F_OE indicates an output enable signal, wherein data is output from the flash memory during F_OE=L level in the reading operation, and prior to input of a command, the program is started from a condition of F_OE=H level (i.e., output disabled condition).

It is noted that, since functions and timings of the flash control signals are published by data sheet, the explanation in details thereof is omitted here.

In the reading operation shown in FIG. 3A, in the read open step, at rising edge timings of the signal F_WE, the flash memory latches the data existing on the flash data bus F_DIO and confirms the data as flash command, lower 8 bits of block address and upper 8 bits of block address in this order and enters a read command operation mode. Then, the data output preparation is performed inside the flash memory and the preparation is completed after a time lapse of "tA".

Next, in the read_sector steps, at rising edge timings of F_WE, the flash memory latches the data existing on the flash data bus F_DIO and confirms the latched data as lower 8 bits of column address and upper 8 bits of column address in this- order and outputs the latched data of the corresponding address in synchronization with the serial clock signal F_SC. At this time, by giving the buffer RAM address signal Rx_ADR and write enable signal Rx_WE to the buffer RAM (R1 or R2), the output data of the flash memory is written to the buffer RAM. This process is executed until the data transmission of one sector is completed.

In this embodiment, since one block is comprised of four sectors, the read_sector steps are repeated at most four times. Namely, upon completion of data transmission corresponding to one sector, the process proceeds to the next sector by sequentially designating, respectively in sector units, from sector 0 to sector 4 to thereby perform sending and receipt of data between the host terminal and the flash memory through the two buffer RAMs.

In the read_close step, the level of the chip enable signal F_CE is made inactive (i.e., High) to thereby clear up the contents of the flash memory.

In the writing operation shown in FIG. 3B, in the write open step, at rising edge timings of the signal F_WE, the flash memory latches the data existing on the flash data bus F_DIO and confirms the data in a similar manner to that of the read_open step shown in FIG. 3A and enters a write command operation mode.

Next, in the write_sector steps, at rising edge timings of F_WE, the flash memory latches the data existing on the flash data bus F_DIO and confirms the latched data as lower 8 bits of column address and upper 8 bits of column address in this order, and then takes the latched data as the data of the corresponding address at the rising edge timings of the serial clock signal F_SC. At this time, by supplying the buffer RAM address signal Rx_ADR and output enable signal Rx_OE to the buffer RAM (R1 or R2) in synchronization with the serial clock signal F_SC, the corresponding data output from the buffer RAM can be written in the flash memory. This process is executed until the data transmission of one sector is completed.

In this embodiment, since one block is comprised of four sectors, the write_sector steps are repeated at most four times.

Finally, in the write_close step, a confirm command on the flash data bus F_DIO is supplied to the flash memory at the rising edge timing of F_WE. Then, the control program enters the writing operation mode inside the flash memory. During the writing operation, the flash memory is in a busy state and can not receive a flash command.

In the present invention, since the control signal levels are kept as they are at the time of completion of each sector, the flash command can be continued even if there exists some time lag until the following step is started. Specifically, data transmission is performed between the host terminal and the buffer RAMs during each step. This will be described with reference to FIGS. 4 and 5.

FIG. 4 illustrates an operation flowchart of the control signal generating sequencer (SEQ) in the reading operation of the semiconductor memory device. First, in Step #401, various parameters are initialized to obtain the starting block address (BA) for reading and starting sector number (sect) for reading and a number of sectors (SC) to be transmitted for reading. Since one block is comprised of four sectors in this embodiment, the sector number "sect" is assigned to 0, 1, 2 and 3. In this step #401, the selector selection signal FLASHBUFSEL is initialized to be 0.

In Step #402, the process for applying the read command/block address shown as the read_open step in FIG. 3A is performed with respect to the block of the block address, BA. Next, in Step #403, the program proceeds to the read_sector process with respect to the sector number (sect) and the data of the corresponding sector is transmitted from the flash memory to the buffer RAM (R1 or R2). At this time, one of the buffer RAMs is selected by the selector selection signal FLASHBUFSEL, and the transmission data is stored in the selected buffer RAM.

In Step #404, the number (SC) of the transmission sectors is decreased by 1 where the number SC serves as a loop counter value. In Step #405, it is determined whether or not the data is being transmitted from the buffer RAM to the host terminal. In the transmission of the first sector, since the data thereof is not yet transmitted to the host terminal, the determination in Step #405 is "N" and the process is transferred to Step #407. In the transmission of the second sector and thereafter, it is determined whether the data of the first sector is being transmitted to the host terminal. If the data is being transmitted to the host terminal ("Y" in Step #405), the process is transferred to Step #406 and completion of the data transmission is awaited.

In Step #407, the value of the selector selection signal FLASHBUFSEL is substituted for the selector selection signal HOSTBUFSEL, and the selector selection signal FLASHBUFSEL (0 or 1) switches the buffer RAMs between R1 and R2. By this arrangement, the buffer RAMs R1 and R2 are alternately switched.

In Step #408, a request for data transmission is issued to the host terminal to indicate that the data to be transmitted is prepared in the buffer RAM. Upon receipt of the data transmission request, the host terminal receives and reads the data from the buffer RAM in Step #409. At this time, the buffer RAM is selected by. the selector selection signal HOSTBUFSEL and the data read out from the flash memory in Step #403 is outputted from the selected buffer RAM.

In Step #410, it is determined whether the number (SC) of sectors to be transmitted is larger than 0, and in case no untransmitted sectors is present (SC=0, i.e., "N" in Step #410), the program proceeds to Step #411 and the read_close step is performed. In case untransmitted sectors are present (SC>0, i.e., "Y" in Step #410), the program proceeds to Step #412 and the present sector number "sect" is increased by 1.

It is determined in Step #413 whether the sector number "sect" exceeds the block size, namely, determined whether "sect">4 in this embodiment. In case the sector number is not more than the block size value (i.e., "N" in Step #413), the program returns to the process of Step #403 and the processes thereafter are repeated. In case the number is larger than the block size value (i.e., "Y" in Step #413), this indicates that the process of the subject sectors exceeds a boundary of the blocks. Therefore, the block process is once closed, namely, the read_close step is performed in Step #414 is performed, and then in Step #415 the sector number "sect" is initialized to be 0 and the block address (BA) is incremented to the next block, and the processes from the Step #402 and on are repeated again.

While the upper limit for the sector number is set to be 4 sectors in the present embodiment, the present invention is not limited to this, and the sector size for a single block may be arbitrarily set.

FIG. 5 illustrates an operation flowchart of the control signal generating sequencer (SEQ) in the writing operation of the semiconductor memory device. First, in Step #501, various parameters are initialized to obtain the starting block address (BA) for writing and starting sector number (sect) for writing and a number of sectors (SC) to be transmitted for writing. Since one block is comprised of four sectors in this embodiment, the sector number "sect" is assigned to 0, 1, 2 and 3. In this step #501, the selector selection signal HOSTBUFSEL is initialized to be 0.

In Step #502, a request for data transmission is issued to the host terminal. Upon receipt of the request, the host terminal sends the data to be written to the buffer RAM in Step #503. At this time, the buffer RAM R1 or R2 is selected by the selector selection signal HOSTBUFSEL.

In Step #504, the program completion is awaited to confirm that the flash memory is in a ready condition. In the transmission of the first sector, since the data thereof is not yet written to the flash memory, there arises no busy condition of the flash memory. However, in the transmission of the second sector and thereafter, there may be a case of a busy condition of the flash memory, and therefore it is necessary to await until the flash memory becomes the ready condition because the flash memory does not receive a command in the busy condition.

Next, in Step #505, the process for applying the write command/block address shown as the write_open step in FIG. 3B is performed with respect to the block of the block address BA. In Step #506, the program awaits until the data transmission of one sector from the host terminal to the buffer RAM (shown in Step #503) is completed. Upon completion of the data transmission, this indicates that the buffer RAM selected by the selector selection signal HOSTBUFSEL is filled with the sector data to be written.

Next, in Step #507, the value of HOSTBUFSEL (0 or 1) is substituted for FLASHBUFSEL so that the selector selection signal HOSTBUFSEL switches the buffer RAMs between R1 and R2. By this arrangement, the buffer RAMs can be alternately selected.

In Step #508, the number (SC) of the transmission sectors is decreased by 1 where the number SC serves as a loop counter value. In Step #509, it is determined whether the number (SC) of sectors to be transmitted is larger than 0, and in case SC=0, i.e., "N" in Step #509, the program proceeds to Step #510 and the write_sector step is performed to transmit the sector data from the buffer RAM to the flash memory. In Step #511, the write_close process is performed, and then the program completion is awaited until the flash memory responses the ready condition in Step #512.

In case SC>0, i.e., "Y" in Step #509, the program proceeds to Step #513 and a request for data transmission is issued to the host terminal. Upon receipt of the request, the host terminal sends the data to be written to the buffer RAM in Step #514. At this time, the buffer RAM is selected by the selector selection signal HOSTBUFSEL.

Next, in Step #515, the program proceeds to the write_sector process with respect to the sector number (sect) and the data of the corresponding sector is transmitted from the buffer RAM (R1 or R2) to the flash memory. At this time, one of the buffer RAMs is selected by the selector selection signal FLASHBUFSEL. In Step #516, the present sector number "sect" is incremented by 1.

It is determined in Step #517 whether the sector number "sect" exceeds the block size, namely, determined whether "sect">4 in this embodiment. In case the sector number is not more than the block size value (i.e., "N" in Step #517), the program returns to the process of Step #506 and the processes thereafter are repeated. In case the number is larger than the block size value (i.e., "Y" in Step #517), this indicates that the process of the subject sectors exceeds a boundary of the blocks. Therefore, the block process is once closed, namely, the write_close step is performed in Step #518, and then in Step #519 the sector number "sect" is initialized to be 0 and the block address (BA) is incremented to the next block, and the processes from the Step #504 and on are repeated again.

By the control operations as described above, by providing two buffer RAMs each having one sector size, the flash memory having a plurality of blocks each of which has a block size of four sectors can be controlled in block units and high speed transmission can be achieved.

It is noted that, although the present embodiment describes an example of a flash memory in which one block size corresponds to four sectors, it is not limited to this and one block size may be any number of sectors. In this case, in Step #413 in FIG. 4 and Step #517 in FIG. 5, it is merely necessary that the block size be appropriately varied.

According to the present embodiment, it is possible to remarkably decrease the capacity of the buffer RAMs compared to those corresponding to a plurality of sectors as in the prior art, and manufacture thereof may be achieved at low costs, and since it is further possible to perform parallel processing of data transmission, rapid transmission may be realized in view of the host. Moreover, since processes are performed in block units with respect to the flash memory, it is possible to perform rapid writing and reading of data.

EMBODIMENT 2

Figure 6:
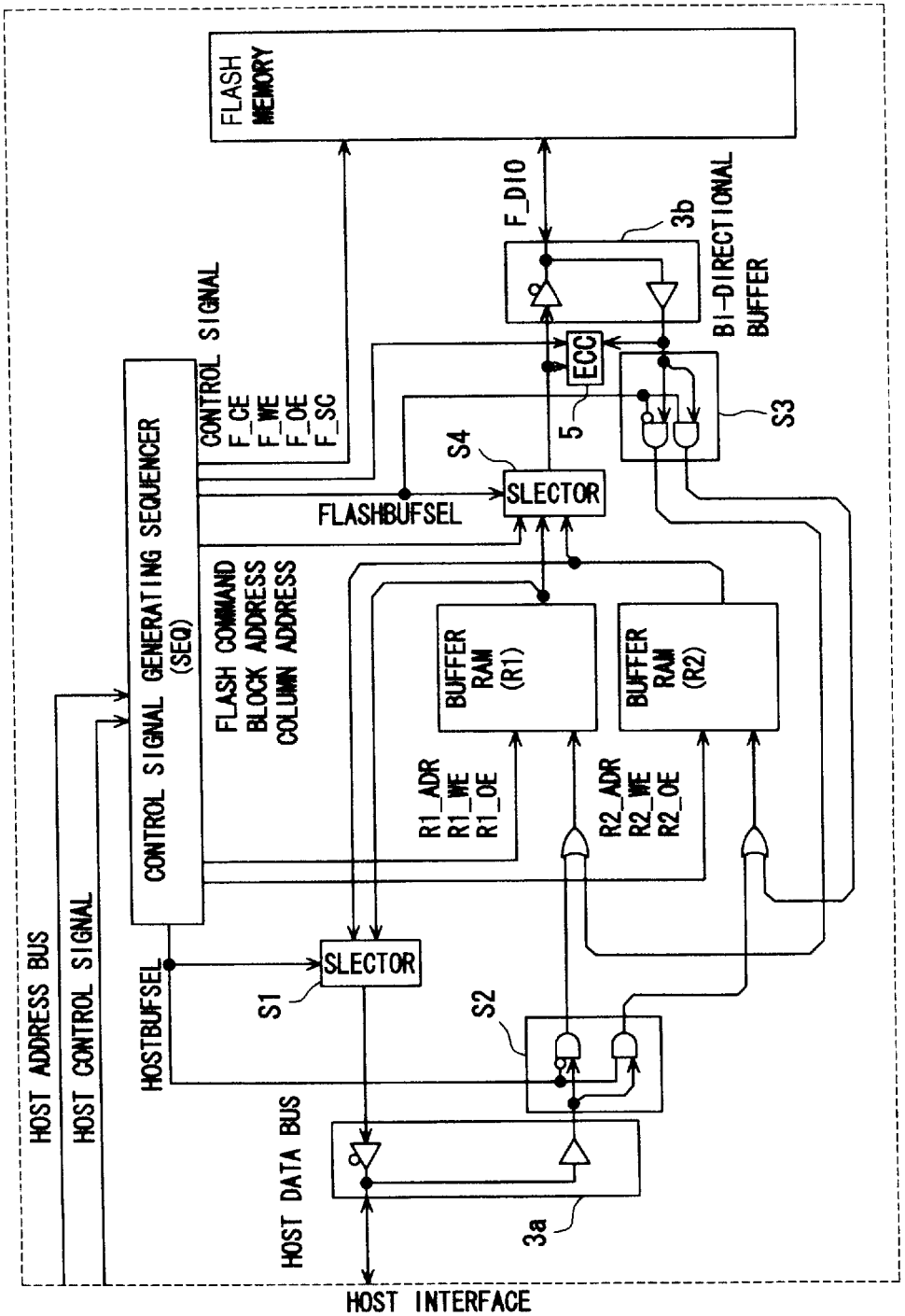
FIG. 6 is a block diagram of a second embodiment of the semiconductor memory device according to the present invention.

The second embodiment of the present invention will now be explained with reference to FIG. 6. The structural differences between the second embodiment and the first embodiment reside in the provision of an error correction controlling unit (ECC) 5 in the second embodiment. As illustrated in FIG. 6, the error correction controlling unit (ECC) 5 is interposed between the selectors S3, S4 and the bidirectional buffer 3*b* and is connected across the data bus lines DI and DO. Thus, redundant data for error correction may be transmitted to the error correction controlling unit (ECC) 5 together with sector data in parallel with read out data from the flash memory 2 to the buffer RAMs (R1, R2). Thus, when correctable errors shall be detected, data may be corrected-on the buffer RAM.

When performing a write operation of data from the buffer RAM to the flash memory, sector data is transmitted to the error correction controlling unit (ECC) 5 in parallel therewith to generate redundant data, and the generated redundant data is transmitted to the flash memory 2. The redundant data for error correction are arranged to be stored immediately after the sector data for each sector data. It should be noted that since the remaining components are common to those of the first embodiment, further explanations thereof will be omitted here.

With this arrangement, it is possible to exhibit an effect of achieving improvements in reliability of data to be processed through error correction, in addition to the effects that may be achieved in the first embodiment.

EFFECT OF THE INVENTION

As explained so far, according to the present invention, manufacture at low costs is enabled since it is possible to reduce the capacity of the buffer RAMs, and rapid transmission from the host may be realized since parallel processing of data transmission is possible. It is further possible to perform rapid writing and reading of data since processes are performed in block units with respect to the flash memory. It is moreover possible to improve reliability of data through error correction without affecting the above effects.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. A semiconductor memory device which is connected to a host terminal through a system bus for data transmission, the semiconductor memory device comprising:

a nonvolatile semiconductor memory having a structure of a plurality of blocks, wherein read and write commands are executed in block units, with a capacity size of a single block being an integer multiple of a single sector size corresponding to a processing unit of the host terminal for reading and writing data;

a first buffer memory and a second buffer memory for mediation of data transmission between the host terminal and the nonvolatile semiconductor memory, each of the first and second buffer memories having a capacity corresponding to a single sector size of the nonvolatile semiconductor memory, and a controller for controlling data transmission in sector units between the host terminal and the buffer memories and between the nonvolatile memory and the buffer memories by alternately selecting the first and second buffer memories, and when one of the buffer memories performs transmission of data corresponding to one sector with the host terminal, the other buffer memory simultaneously performs transmission of data corresponding to another sector with the nonvolatile semiconductor memory.

2. The semiconductor memory device according to claim 1, wherein the controller generates control signals to apply a read and write command with respect to a block of the nonvolatile semiconductor memory in response to a request for reading and writing data from the host terminal, and wherein transmission of data between the host terminal and the nonvolatile semiconductor memory is sequentially performed via the buffer memories every sector data.

3. The semiconductor memory device according to claim 2, wherein the controller is adapted to maintain control levels of the control signals for the nonvolatile semiconductor memory in a manner that, after transmission of a single sector data, transmission of another sector data is continued to thereby perform simultaneous and parallel data transmission.

4. The semiconductor memory device according to claim 1, further comprising an error correcting unit for performing correction control of errors of data stored in the nonvolatile semiconductor memory, wherein redundant data for the error correction of each sector data is arranged to immediately follow each sector data.

5. The semiconductor memory device according to claim 4, wherein the error correcting unit is arranged such that, when in a data reading operation from the nonvolatile semiconductor memory to the buffer memory, each sector data and redundant data are sent to the error correcting unit simultaneously and in parallel with the data reading and when a correctable error is detected, the sector data stored in the buffer memory is corrected, and that, when in a data writing operation from the buffer memory to the nonvolatile semiconductor memory, each sector data is transferred to the error correcting unit simultaneously and in parallel with the data writing to produce redundant data which is transmitted to the nonvolatile semiconductor memory.

6. A method of reading out data from a flash memory which is connected to a host terminal through two buffer memories connected on a system bus. for data transmission, comprising:

performing a read_open process by applying a read command and block address with respect to a target block;

performing a read_sector process with respect to a sector number of a target sector to transmit data of the corresponding sector from the flash memory to one of the buffer memories;

issuing a request for data transmission to the host terminal;

transmitting the data from one of the buffer memories to the host terminal upon receipt of the request; and performing a read_close process to close the block processing when the sector number is larger than a predetermined block size, wherein when one of the buffer memories performs transmission of data corresponding to a single sector with respect to the host terminal, the other buffer memory simultaneously performs transmission of data corresponding to another single sector with respect to the flash memory.

7. A method of writing data to a flash memory which is connected to a host terminal through two buffer memories connected on a system bus for data transmission, comprising:

performing a write_open process by applying a write command and block address with respect to a target block issuing a request for data transmission to the host terminal;

upon receipt of the request, sending the data to be written from the host terminal to one of the buffer memories;

performing a write_sector process to transmit a target sector data from one of the buffer memories to the flash memory; and performing a write_close process to close a block process when the sector number is larger than a predetermined block size value, wherein when one of the buffer memories performs transmission of data corresponding to a single sector with respect to the host terminal, the other buffer memory simultaneously performs transmission of data corresponding to another single sector with respect to the flash memory.

* * * * *